United States Patent [19]

Temer

[11] Patent Number: 4,652,835
[45] Date of Patent: Mar. 24, 1987

[54] GAIN CONTROL BANDPASS LCR FILTER WITH VARIABLE BANDWIDTH

[75] Inventor: Vladan Temer, Santa Rosa, Calif.

[73] Assignee: Hewlett-Packard Company, Palo Alto, Calif.

[21] Appl. No.: 825,961

[22] Filed: Feb. 4, 1986

Related U.S. Application Data

[63] Continuation of Ser. No. 644,483, Aug. 27, 1984, abandoned.

[51] Int. Cl.$^4$ .................. H03F 3/191; H03F 3/193
[52] U.S. Cl. ............................ 330/306; 330/302; 330/303
[58] Field of Search ........... 330/149, 151, 278, 279, 330/302, 303, 304, 305, 306; 333/167, 175, 178

[56] References Cited

U.S. PATENT DOCUMENTS 3,936,830 2/1976 Overbury .................. 333/175 X
4,496,859 1/1985 Crooks .................... 330/302 X Primary Examiner—Eugene R. LaRoche
Assistant Examiner—Steven J. Mottola
Attorney, Agent, or Firm—Douglas L. Weller

[57] ABSTRACT

A bandpass filter is presented which allows variation of bandwidth while passband gain remains constant. The presented bandpass filter relies on feedforward (as opposed to feedback) to compensate for losses within the bandpass filter. Two feedforward circuits are shown, one a current source and the other a voltage source in series with a resistance.

8 Claims, 8 Drawing Figures

GAIN CONTROL BANDPASS LCR FILTER WITH VARIABLE BANDWIDTH

This application is a continuation of application Ser. No. 644,483, filed 8/27/84, now abandoned.

BACKGROUND

Certain applications for bandpass filters require variation of filter bandwidth without attendant variation in gain.

FIG. 1 shows a signal source 11 connected to a prior art bandpass filter 19. Signal source 11 generates a signal $S_{in}$ which has a voltage $V_i$. Bandpass filter 19 includes a variable resistance 12 connecting signal source 11 to an output node 16 and to a resonant LC circuit 17. A signal $S_{out}$ having a voltage $V_o$ appears on output node 16. LC circuit 17 comprises a capacitance 13 and an inductance 14. A resistance 15 (the magnitude of resistance 15 is referred to in formulas herein as $R_{15}$) represents the equivalent of the losses in LC circuit 17, and the losses in the load connected to output node 16. Signal source 11, capacitance 13, inductance 14, and resistance 15 are all connected to a reference voltage source 10.

Varying the magnitude of variable resistance 12 varies the bandwidth of bandpass filter 19 of FIG. 1. Approximately, the bandwidth of bandpass filter 19 is proportional to the multiplicative inverse of the value of variable resistance 12. However, varying resistance 12 also varies the passband gain ($V_o/V_i$) of bandpass filter 19.

FIG. 3 shows how the passband gain of bandpass filter 19 varies as a function of change in magnitude of resistance 12. An axis 82 represents the magnitude of resistance 12, an axis 81 represents the passband gain of bandpass filter 19, a line 84 is a plot of unity gain ($V_o=V_i$) and a plot 83 shows how the gain of bandpass filter 19 asymptotically approaches unity as the resistance R12 is decreased.

In order to vary bandwidth without varying passband gain, a positive feedback loop may be used.

For instance, in FIG. 2 an amplifier 27 and a resistance 28 have been added to bandpass filter 19 to form bandpass filter 29. If, for example, amplifier 27 is chosen to have a gain of 2, then resistance 28 would be chosen to have the same resistance value as resistance 15. The addition of positive feedback as in the bandpass filter 29, however, may degrade the performance of bandpass filter 19 as noise and distortion within amplifier 27 may be multiplied and appear at output node 16.

SUMMARY OF THE INVENTION

In accordance with the preferred embodiments of the present invention, a bandpass filter is presented which allows variation of bandwidth while gain remains constant. The presented bandpass filter relies on feedforward (as opposed to feedback) to compensate for losses within the bandpass filter. Two feedforward circuits are shown, one using a current source and the other using a voltage source in series with a resistance.

DESCRIPTION OF THE PREFERRED EMBODIMENTS

Figure 1:
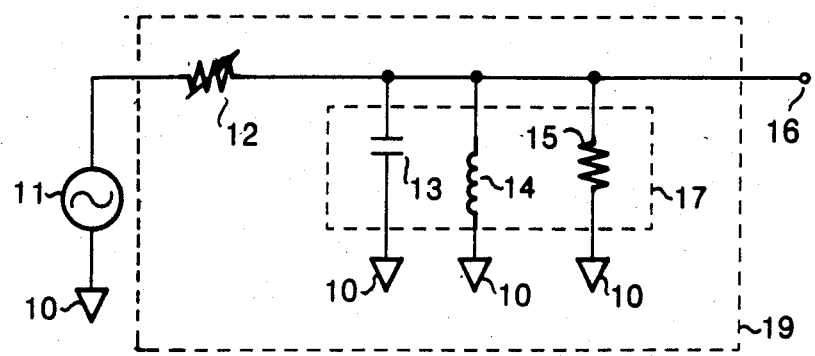
FIGS. 1 and 2 show prior art bandpass filters.
Figure 2:
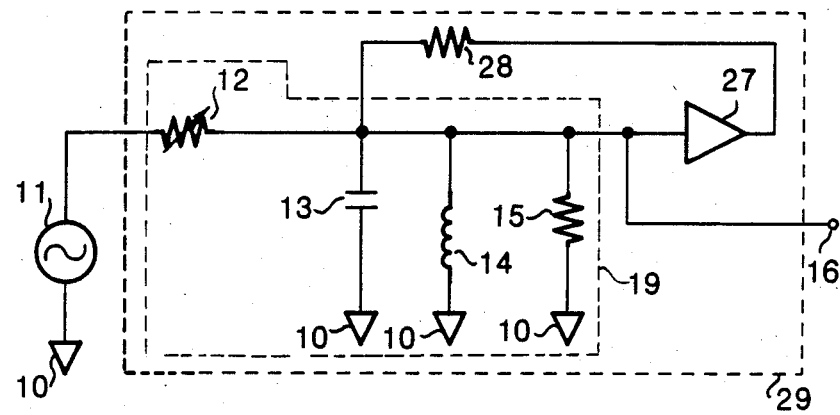
Figure 4:
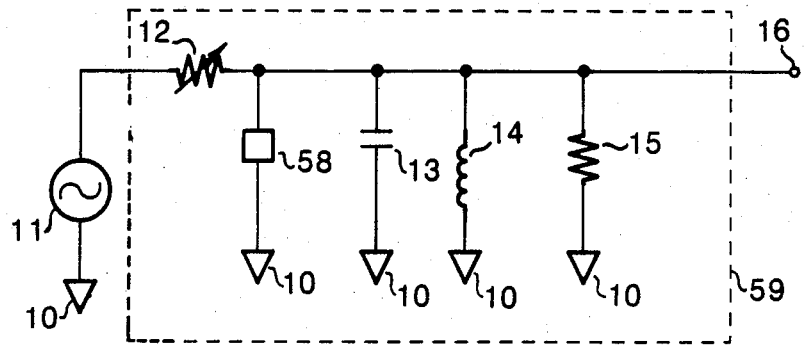
FIGS. 4, 5 and 6 show a bandpass filter in accordance with a preferred embodiment of the present invention.
Figure 3:
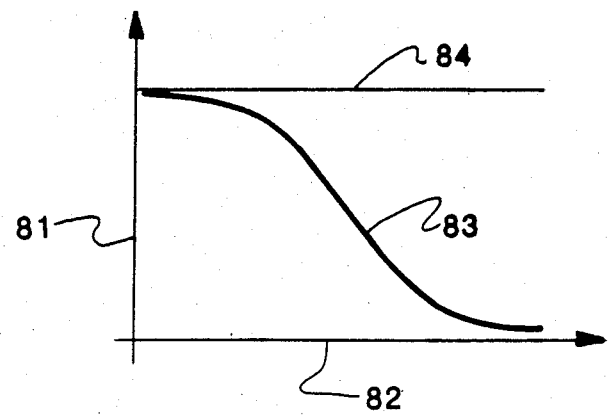
FIG. 3 shows how the gain of the bandpass filter in FIG. 1 varies with change in a variable resistance within the bandpass filter.

FIG. 4 shows signal generator 11 coupled to a bandpass filter 59. Bandpass filter 59 is similar to bandpass filter 19 shown in FIG. 1, except for the addition of a circuit component 58 incorporated within bandpass filter 59 as shown. Variable resistance 12 may comprise a pin diode.

Figure 5:
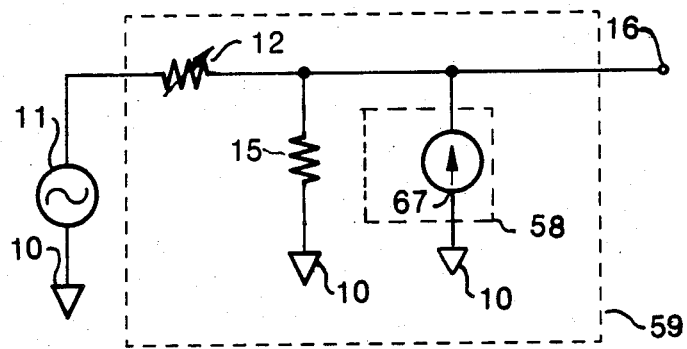

FIG. 5 is an equivalent circuit of the circuit in FIG. 4 when signals $S_{in}$, generated by signal generator 11, is at the center frequency ($f_c$) of bandpass filter 59. In FIG. 5, circuit component 58 is shown to be a current source 67. As can be derived, $V_o$ will equal $V_i$ (i.e. there is unity gain) when current source 67 produces a current I so that:

$$I=V_i/R_{15}$$

Figure 6:
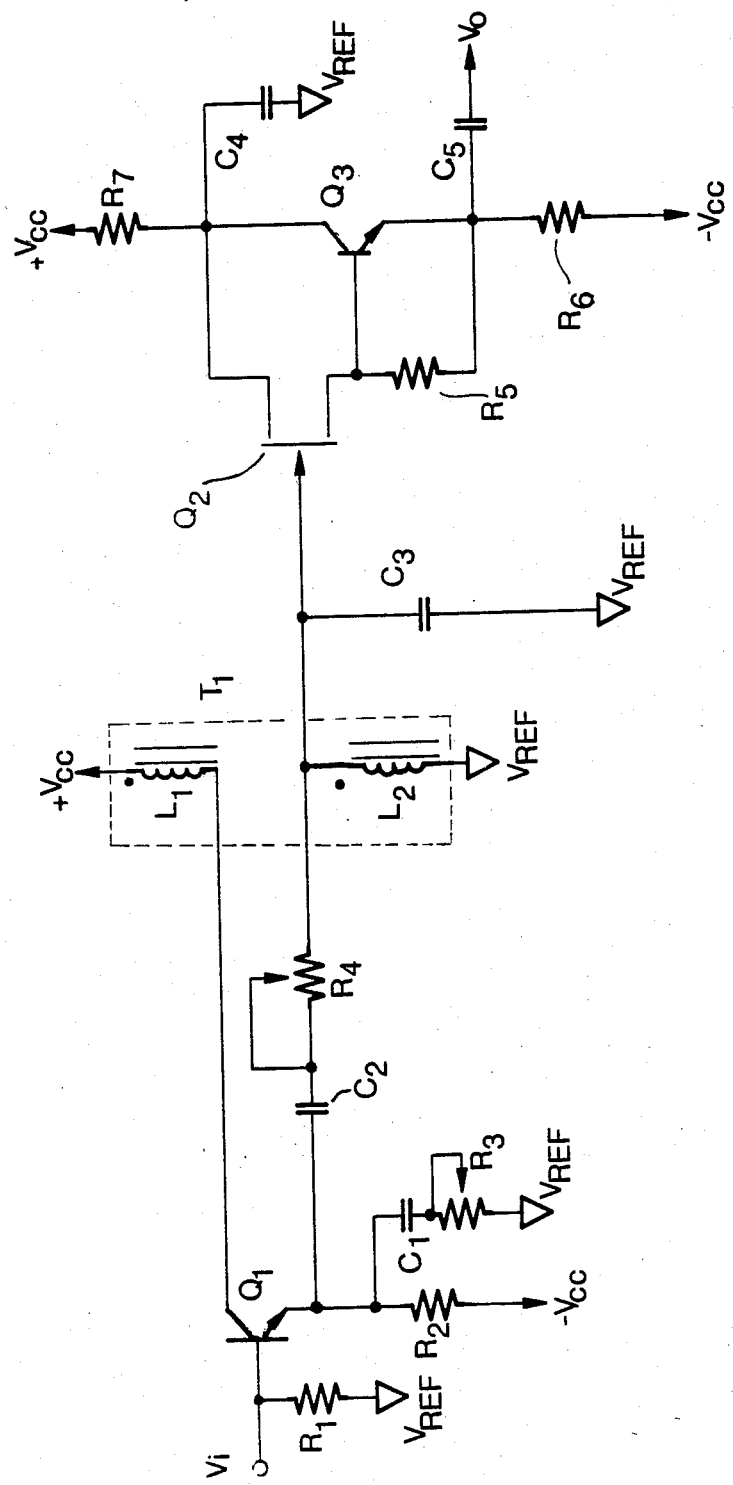

FIG. 6 is a schematic of an embodiment of bandpass filter 59 which shows actual values for circuit components when the center frequency ($f_c$) of bandpass filter 59 is 3 Megahertz (MHz).

An input voltage $V_i$ is fed into a base of a transistor $Q_1$. Transistor $Q_1$ has a part number 2N3904, and can be purchased from Motorola, Inc. The base of transistor $Q_1$ is connected across a resistance $R_1$ to a reference voltage $V_{ref}$. Resistance $R_1$ has a value of 51.1 ohms. An emitter of transistor $Q_1$ is connected across a resistance $R_2$ to a negative voltage supply $-V_{cc}$. Resistance $R_2$ has a value of 2150 ohms, and negative voltage supply $-V_{cc}$ has a value of $-12$ volts. The emitter of transistor $Q_1$ is also connected in series across a capacitance $C_1$ and a variable resistance $R_3$ to reference voltage $V_{ref}$. Capacitance $C_1$ has a value of 0.1 micro-farads, and variable resistance $R_3$ has an operating value of 2000 ohms.

The emitter of transistor $Q_1$ is also connected in series across a capacitance $C_2$ and a variable resistance $R_4$ to a gate of a field effect transistor, abbreviated FET, $Q_2$. Capacitance $C_2$ has a value of 0.1 micro-farads, and variable resistance $R_4$ has an operating value of 20,000 ohms. FET $Q_2$ has a part number 2N4416A, and can be purchased from Siliconics, Inc. The gate of FET $Q_2$ is connected to reference voltage $V_{ref}$ across an inductance $L_2$ and a capacitance $C_3$ coupled in parallel. Inductance $L_2$ has a value of 1 micro-henry, and capacitance $C_3$ has a value of 2400 pico-farads. The collector of transistor $Q_1$ is connected across an inductance L1 to a positive voltage supply $+V_{cc}$. Positive voltage supply $+V_{cc}$ has a value of $+12$ volts. Inductance $L_1$ and inductance $L_2$ form a transformer $T_1$. A 1:4 turns ratio exists between inductance $L_1$ and inductance $L_2$.

A drain of FET $Q_2$ is connected to a collector of a transistor $Q_3$. Transistor $Q_3$ has a part number 2N3904, and can be purchased from Motorola, Inc. The collector of transistor $Q_3$ is connected across a resistance $R_7$ to voltage supply $+V_{cc}$. Resistance $R_7$ has a value of 1000 ohms. The collector of transistor $Q_3$ is connected across a capacitance $C_4$ to reference voltage $V_{ref}$. Capacitance $C_4$ has a value of 0.1 micro-farads.

A source of FET $Q_2$ is connected to a base of transistor $Q_3$. The source of FET $Q_2$ is also connected across a resistance $R_5$ to an emitter of transistor $Q_3$. Resistance $R_5$ has a value of 1470 ohms. The emitter of transistor $Q_3$ is connected across a resistance $R_6$ to negative voltage supply $-V_{cc}$. Resistance $R_6$ has a value of 2150 ohms. The emitter of transistor $Q_3$ is connected across a capacitance $C_5$ to an output node. Capacitance $C_5$ has a value of 0.1 micro-farads. An output voltage $V_o$ exists at the output node.

A current source 67 is depicted in FIG. 5. As can be seen from FIG. 6, current source 67 includes transformer $T_1$. Alternate means for constructing current source 67 include using a transistor and a transformer, or a transistor alone.

Figure 8:
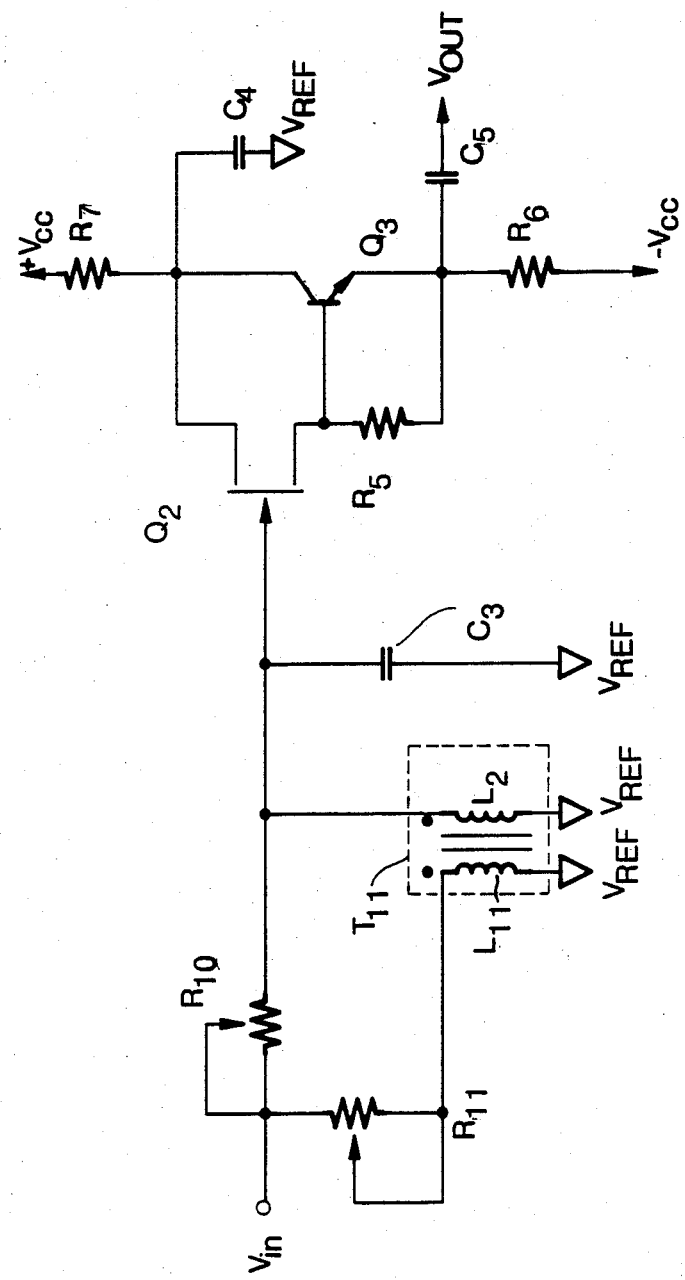

FIG. 8 is a schematic of an embodiment of bandpass filter 59 which shows actual values for circuit components when the center frequency ($f_c$) of bandpass filter 59 is 3 MHz. An input voltage $V_{in}$ is connected across a variable resistance $R_{11}$ *and an inductance $L_{11}$* connected in series to reference voltage $V_{ref}$. Variable resistance $R_{11}$ has an operating value of 2000 ohms. Inductance $L_{11}$ and inductance $L_2$ form a transformer $T_{11}$. A 1:4 turns ratio exists between inductance $L_2$ and inductance $L_2$.

Input voltage $V_{in}$ is fed across a variable resistance $R_{10}$ into the base of FET $Q_2$. Variable resistance $R_{10}$ has an operating value of 20,000 ohms. FET $Q_2$ is connected to circuit components in a manner substantially similar to FIG. 6. An output voltage $V_{out}$ exists at an output node.

Figure 7:
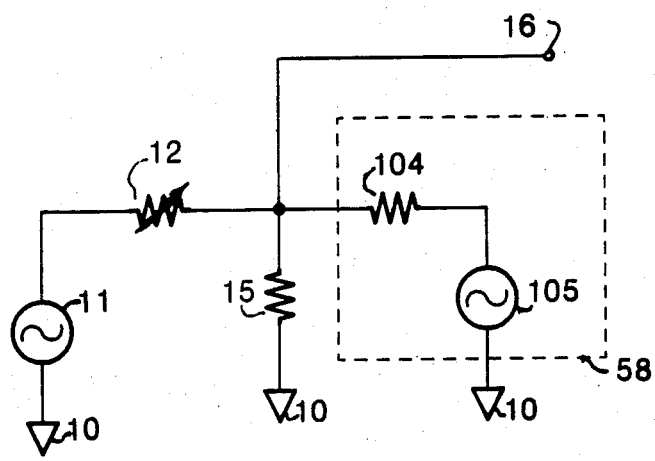
FIGS. 7 and 8 show a second bandpass filter in accordance with a preferred embodiment of the present invention.

A voltage source 105 is depicted in FIG. 7. As can be seen in FIG. 8, voltage source 105 includes transformer $T_{11}$.

I claim:

1. A bandpass filter device for filtering a first signal, the bandpass filter having a center frequency and the first signal being within a range of frequencies and having a first signal voltage, the device comprising:
    a reference voltage source;
    an input means for receiving the first signal;
    an output node;
    a resonant impedance, including a resonant circuit and an equivalent parasitic resistance, coupled to the output node and to the reference voltage;
    current generation means, coupled to the output node, for generating a current, wherein the current varies proportionately with the first signal voltage when the first signal voltage is within the range of frequencies and the current is substantially independent of voltage changes at the output node caused by the resonant circuit, and wherein the amount of current produced by the current generation means when the first signal is at the center frequency is substantially equal to the amount of current through the equivalent parasitic resistance.

2. A bandpass filter as in claim 1 wherein the input means includes a bandwidth control means for changing the center frequency of the bandpass filter.

3. A bandpass filter as in claim 2 wherein the bandwidth control means is a variable resistor.

4. A bandpass filter as in claim 1 wherein the resonant impedance includes an inductance and capacitance in parallel.

5. A bandpass filter device for filtering a first signal, the bandpass filter having a center frequency and the first signal being within a range of frequencies and having a first signal voltage, the device comprising:
    a reference voltage source;
    an input means for receiving the first signal;
    an output node;
    a resonant impedance, including a resonant circuit and an equivalent parasitic resistance, coupled to the output node and to the reference voltage;
    signal generation means of generating a second signal, the second signal having a second signal voltage, wherein the second signal voltage varies proportionately to the first signal voltage when the first signal voltage is within the range of frequencies, and wherein the second signal is substantially independent of voltage changes at the output node caused by the resonant circuit; and,
    a resistor means, coupled to the output node and to the signal generation means, for producing a resistance, wherein the amount of resistance produced is such that when the first signal is at the center frequency, the amount of current through the resistor means is substantially equal to the amount of current through the equivalent parasitic resistance.

6. A bandpass filter as in claim 5 wherein the input means includes a bandwidth control means for changing the center frequency of the bandpass filter.

7. A bandpass filter as in claim 6 wherein the bandwidth control means is a variable resistor.

8. A bandpass filter as in claim 5 wherein the resonant impedance includes an inductance and capacitance in parallel.

* * * * *